(12) United States Patent
Rinderer

(10) Patent No.: US 6,481,582 B1
(45) Date of Patent: Nov. 19, 2002

(54) RACK

(75) Inventor: Eric R. Rinderer, Highland, IL (US)

(73) Assignee: Cooper Technologies Company, Houston, TX (US)

( * ) Notice: Subject to any disclaimer, the term of this patent is extended or adjusted under 35 U.S.C. 154(b) by 0 days.

(21) Appl. No.: 09/873,839

(22) Filed: Jun. 4, 2001

(51) Int. Cl.$^7$ ................................................ A47F 5/00
(52) U.S. Cl. .................... 211/26; 312/223.2; 312/265.4; 361/683; 52/167.1
(58) Field of Search ........................ 211/26; 312/223.1, 312/223.2, 265.4; 361/829, 683; 52/167.1

(56) References Cited

U.S. PATENT DOCUMENTS

| | | |
|---|---|---|
| 1,024,253 A | 4/1912 | Ford |
| 1,214,738 A | 2/1917 | Wolf |
| 1,516,711 A | 11/1924 | Christell |
| 1,957,362 A | 5/1934 | Smith |
| 2,045,942 A | 6/1936 | Brody |
| 2,058,263 A | 10/1936 | Rosendale |
| 2,114,155 A | 4/1938 | Streich |
| 2,386,019 A | 10/1945 | Watter |
| 2,727,364 A | 10/1955 | Perez |
| 2,875,902 A | 3/1959 | Ayars, Jr. |
| 2,950,786 A | 8/1960 | Markle |
| 2,959,715 A | 11/1960 | Leonchick |
| 3,075,818 A | 1/1963 | Fay |
| 3,160,280 A | 12/1964 | Burch |
| 3,178,246 A | 4/1965 | Riles |
| 3,192,306 A | 6/1965 | Skonnord |
| 3,265,419 A | 8/1966 | Durnbaugh et al. |
| 3,297,383 A | 1/1967 | Fay |
| 3,332,374 A | 7/1967 | Ferdinand et al. |
| 3,409,258 A | 11/1968 | Carlson |
| 3,420,381 A | 1/1969 | Bradfield |
| 3,537,221 A | 11/1970 | Helfman et al. |
| 3,598,066 A | 8/1971 | Polezoes |

(List continued on next page.)

FOREIGN PATENT DOCUMENTS

| | | |
|---|---|---|
| DE | 28 45 578 | 4/1980 |
| DE | 33 07 778 A1 | 9/1984 |
| DE | 37 37 261 A1 | 5/1989 |
| DE | 44 39 622 C1 | 11/1995 |
| DE | 198 60 404 C1 | 7/2000 |
| DE | 198 60 406 C1 | 10/2000 |
| EP | 0 650 317 B1 | 1/1999 |
| GB | 815777 | 7/1959 |
| GB | 983471 | 2/1965 |
| GB | 2 345 239 A | 7/2000 |
| JP | 44-19881 | 2/1965 |

OTHER PUBLICATIONS

Lincoln Electric, How Welding Simplifies the Design of Brackets, Product Engineering, Nov. 1948, p. 196.

Hendry Telephone Products, Relay Racks, pages cover, 12, 13 & 55, Sep. 1988.

Magnetic Controls Co., Rack, 19" Relay, 2" Mounting, 2 pages, Oct. 1981.

Magnetic Controls Co., Rack Junctions, 1 page, Sep. 8, 1981.

ITT Telecommunications, Unequal Flange Rack, 2 pages, Mar. 11, 1975.

(List continued on next page.)

Primary Examiner—Robert W. Gibson, Jr.
(74) Attorney, Agent, or Firm—Senniger, Powers, Leavitt & Roedel

(57) ABSTRACT

A rack, especially for holding units of electrical equipment one above another, comprising an open rectangular frame having opposite faces. The frame comprises a base, sides constituted by channels, a head and feet on the base for standing it upright, components being configured to be self-squaring for facilitating assembly.

33 Claims, 18 Drawing Sheets

U.S. PATENT DOCUMENTS

| | | |
|---|---|---|
| 3,636,894 A | 1/1972 | Hage |
| 3,640,389 A | 2/1972 | Snyder |
| 3,655,254 A | 4/1972 | Mayer et al. |
| 3,755,716 A | 8/1973 | Yoshii et al. |
| 3,857,494 A | 12/1974 | Giardini |
| 3,871,525 A | 3/1975 | Al-Dabbagh et al. |
| 3,907,445 A | 9/1975 | Wendt |
| 3,931,894 A | 1/1976 | Murphy |
| 3,944,310 A | 3/1976 | Welsh |
| 3,984,884 A | 10/1976 | Spitz |
| 3,989,398 A | 11/1976 | Wendt |
| 4,017,134 A | 4/1977 | Lenglin et al. |
| 4,072,433 A | 2/1978 | Veyhl |
| 4,102,587 A | 7/1978 | Herb et al. |
| 4,114,336 A | 9/1978 | Bechet et al. |
| 4,123,129 A | 10/1978 | Butler |
| 4,126,364 A | 11/1978 | Reilly |
| 4,261,470 A | 4/1981 | Dolan |
| 4,274,547 A | 6/1981 | Takagi et al. |
| 4,317,523 A | 3/1982 | Konstant et al. |
| 4,384,172 A | 5/1983 | Knickerbocker et al. |
| 4,390,103 A | 6/1983 | Husband |
| 4,410,294 A | 10/1983 | Gilb et al. |
| 4,422,792 A | 12/1983 | Gilb |
| 4,461,519 A | 7/1984 | Hildebrandt et al. |
| 4,464,074 A | 8/1984 | Green et al. |
| 4,480,990 A | 11/1984 | Beam et al. |
| 4,497,411 A | 2/1985 | DeBortoli |
| 4,553,674 A | 11/1985 | Yoshikawa et al. |
| 4,572,695 A | 2/1986 | Gilb |
| 4,594,017 A | 6/1986 | Hills |
| 4,607,972 A | 8/1986 | Hennick |
| 4,641,987 A | 2/1987 | Schlegel |
| 4,643,319 A | 2/1987 | Debus et al. |
| 4,662,524 A | 5/1987 | Fullenkamp et al. |
| 4,679,867 A | 7/1987 | Heldenbrand et al. |
| 4,690,286 A | 9/1987 | Horne et al. |
| 4,691,970 A | 9/1987 | Neri |
| 4,702,535 A | 10/1987 | Beun |
| 4,715,502 A | 12/1987 | Salmon |
| 4,729,484 A | 3/1988 | McConnell |
| 4,732,281 A | 3/1988 | Hall, II et al. |
| 4,869,380 A | 9/1989 | Metcalfe et al. |
| 4,899,892 A | 2/1990 | Rheault |
| 4,899,900 A | 2/1990 | Debus et al. |
| 4,928,834 A | 5/1990 | Neiman |
| 4,958,259 A | 9/1990 | Berg et al. |
| 4,964,020 A | 10/1990 | Savage et al. |
| 4,988,008 A | 1/1991 | Blum et al. |
| 4,991,061 A | 2/1991 | Strange |
| 4,997,240 A | 3/1991 | Schmalzl et al. |
| 5,004,107 A | 4/1991 | Sevier et al. |
| 5,020,866 A | 6/1991 | McIlwraith |
| 5,052,565 A | 10/1991 | Zachrei |
| 5,078,283 A | 1/1992 | Wilson |
| 5,091,827 A | 2/1992 | Suret et al. |
| 5,107,993 A | 4/1992 | Zingrini et al. |
| 5,165,770 A | 11/1992 | Hahn |
| 5,202,818 A | 4/1993 | Betsch et al. |
| 5,214,572 A | 5/1993 | Cosimano et al. |
| 5,228,762 A | 7/1993 | Mascrier |
| 5,233,129 A | 8/1993 | Hall |
| 5,250,752 A | 10/1993 | Cutright |
| 5,267,658 A | 12/1993 | Schwenk et al. |
| 5,275,296 A | 1/1994 | Zachrai |
| 5,284,254 A | 2/1994 | Rinderer |
| 5,292,189 A | 3/1994 | Lau et al. |
| 5,295,041 A | 3/1994 | Metivier et al. |
| 5,298,681 A * | 3/1994 | Swift et al. |
| 5,312,005 A * | 5/1994 | Odell ..................... 211/26 X |
| 5,326,162 A | 7/1994 | Bovermann |
| 5,330,066 A | 7/1994 | Carroll |
| 5,370,249 A | 12/1994 | Harvey et al. |
| 5,372,262 A | 12/1994 | Benson et al. |
| 5,375,724 A | 12/1994 | Mazura |
| 5,378,056 A | 1/1995 | Wilson et al. |
| 5,380,083 A | 1/1995 | Jones et al. |
| 5,383,723 A | 1/1995 | Meyer |
| 5,388,903 A | 2/1995 | Jones et al. |
| 5,407,263 A | 4/1995 | Jones et al. |
| 5,422,946 A | 6/1995 | Delakowitz et al. |
| 5,441,337 A | 8/1995 | Mazura et al. |
| 5,443,312 A | 8/1995 | Schluter |
| 5,452,951 A | 9/1995 | Peller |
| 5,488,543 A | 1/1996 | Mazura et al. |
| 5,498,073 A | 3/1996 | Charbonneau et al. |
| 5,508,890 A | 4/1996 | Hirata |
| 5,513,759 A | 5/1996 | Besserer et al. |
| 5,536,079 A | 7/1996 | Kostic |
| 5,540,339 A | 7/1996 | Lerman |
| 5,566,836 A | 10/1996 | Lerman |
| 5,571,256 A * | 11/1996 | Good et al. ..................... 211/26 |
| 5,574,251 A | 11/1996 | Sevier |
| 5,584,406 A | 12/1996 | Besserer et al. |
| 5,645,174 A | 7/1997 | Rieger et al. |
| 5,655,821 A | 8/1997 | Laboch et al. |
| 5,673,985 A | 10/1997 | Mitchell |
| 5,683,001 A | 11/1997 | Masuda et al. |
| 5,695,263 A | 12/1997 | Simon et al. |
| 5,713,651 A | 2/1998 | Essig et al. |
| 5,734,561 A | 3/1998 | Wolf et al. |
| 5,735,411 A | 4/1998 | Flamme et al. |
| 5,749,476 A | 5/1998 | Besserer et al. |
| 5,761,797 A | 6/1998 | Besserer et al. |
| 5,769,519 A | 6/1998 | Nicolai |
| 5,772,296 A | 6/1998 | Hartel et al. |
| 5,775,051 A | 7/1998 | Nicolai et al. |
| 5,779,060 A | 7/1998 | Imamoto et al. |
| 5,788,087 A * | 8/1998 | Orlando ..................... 211/26 |
| 5,791,498 A | 8/1998 | Mills |
| 5,794,794 A | 8/1998 | Hull |
| 5,794,795 A | 8/1998 | Stemmons |
| 5,806,945 A | 9/1998 | Anderson et al. |
| 5,806,946 A | 9/1998 | Benner et al. |
| 5,807,008 A | 9/1998 | Schwenk et al. |
| 5,819,956 A | 10/1998 | Rinderer |
| 5,820,289 A | 10/1998 | Kern et al. |
| 5,930,972 A | 8/1999 | Benner et al. |
| 5,934,485 A | 8/1999 | Harris et al. |
| 5,992,646 A | 11/1999 | Benner et al. |
| 5,992,808 A * | 11/1999 | Morrow ..................... 211/26 X |
| 5,997,117 A | 12/1999 | Krietzman |
| 6,012,791 A | 1/2000 | Benner et al. |
| 6,019,446 A | 2/2000 | Laboch et al. |
| 6,030,063 A | 2/2000 | Benner |
| 6,036,290 A | 3/2000 | Jancsek et al. |
| 6,039,420 A | 3/2000 | Besserer et al. |
| 6,061,229 A | 5/2000 | Gates et al. |
| 6,062,402 A | 5/2000 | Ford |
| 6,062,664 A | 5/2000 | Benner |
| 6,065,612 A | 5/2000 | Rinderer |
| 6,082,837 A | 7/2000 | Battochio et al. |
| 6,095,345 A | 8/2000 | Gibbons |
| 6,102,498 A | 8/2000 | Kohler et al. |
| 6,109,053 A | 8/2000 | Strackbein et al. |
| 6,109,819 A | 8/2000 | Welch |
| 6,115,885 A | 9/2000 | Strickler et al. |
| 6,120,206 A | 9/2000 | Benner et al. |
| 6,123,203 A | 9/2000 | Gibbons |
| 6,123,400 A | 9/2000 | Nicolai et al. |
| 6,138,843 A | 10/2000 | Nicolai et al. |

| | | | |
|---|---|---|---|
| 6,142,591 A | | 11/2000 | Hemann |
| 6,142,594 A | | 11/2000 | Benner et al. |
| 6,145,943 A | | 11/2000 | Reuter et al. |
| 6,149,255 A | | 11/2000 | Benner et al. |
| 6,155,434 A | | 12/2000 | Benner et al. |
| 6,155,658 A | | 12/2000 | Woodward et al. |
| 6,155,660 A | | 12/2000 | Nicolai |
| 6,164,460 A | | 12/2000 | Reuter |
| 6,164,737 A | | 12/2000 | Benner et al. |
| 6,164,985 A | | 12/2000 | Reuter |
| 6,168,249 B1 | | 1/2001 | Chien |
| 6,170,673 B1 | * | 1/2001 | Nicolai .................. 211/26 |
| 6,171,013 B1 | | 1/2001 | Lee |
| 6,174,034 B1 | | 1/2001 | Benner et al. |
| 6,179,133 B1 | | 1/2001 | Reece |
| 6,181,549 B1 | * | 1/2001 | Mills et al. ............... 361/683 |
| 6,202,570 B1 | * | 3/2001 | Kurtsman ................. 108/108 |
| 6,223,908 B1 | * | 5/2001 | Kurtsman ................. 211/26 |
| 6,240,687 B1 | * | 6/2001 | Chong |
| 6,279,754 B1 | * | 8/2001 | Hoss et al. ............... 211/26 |
| 6,321,917 B1 | * | 11/2001 | Mendoza .................. 211/26 |
| 6,349,837 B1 | * | 2/2002 | Serban .................... 211/26 |

OTHER PUBLICATIONS

Rockwell International Corp., Cable–Duct Relay Rack, 1 page, Dec. 8, 1982.

Hubbell Premise Wiring, Inc., Cable Management Relay Rack System, 2 pages, admitted prior art.

Homaco, Inc., Dual Upright Relay Racks, pp. 53 & 54, admitted prior art.

Chatsworth Products, Inc., Universal Self–Support Rack, pp. 10, 11, 12, 15 & 16, admitted prior art.

Zero PFT, Cable Management: Module Networking Frames, 3 pages, admitted prior art.

Hoffman Enclosures Inc., Open Relay, Networking And ..., 1997, 3 pages.

Schroff North America, Open Frame Rack, 1 page, Warwick, RI, admitted prior art.

Newton Instrument, Data Racks, pp. 18, 19 & 20, admitted prior art.

L–COM Connectivity Products, 2000 Connectivity Supplement 1.0, 3 pages, North Andover, MA, admitted prior art.

Newton Instrument, Equipment Racks and Accessories Section, 1996, pp. 1–192, Butner, N.C.

AT&T Network Systems, Installation Guide Seismic Network Bay Frame, pp. 1–21, Jan. 19, 1995.

Newton Instrument Company Catalog, Seismic Products, 1997, pp. i–iii, A–K.

B–Line, Telecom Equipment Supports: Saunders' Cable Runway & Relay Racks, 1998, pp. 71–85, U.S.A.

* cited by examiner

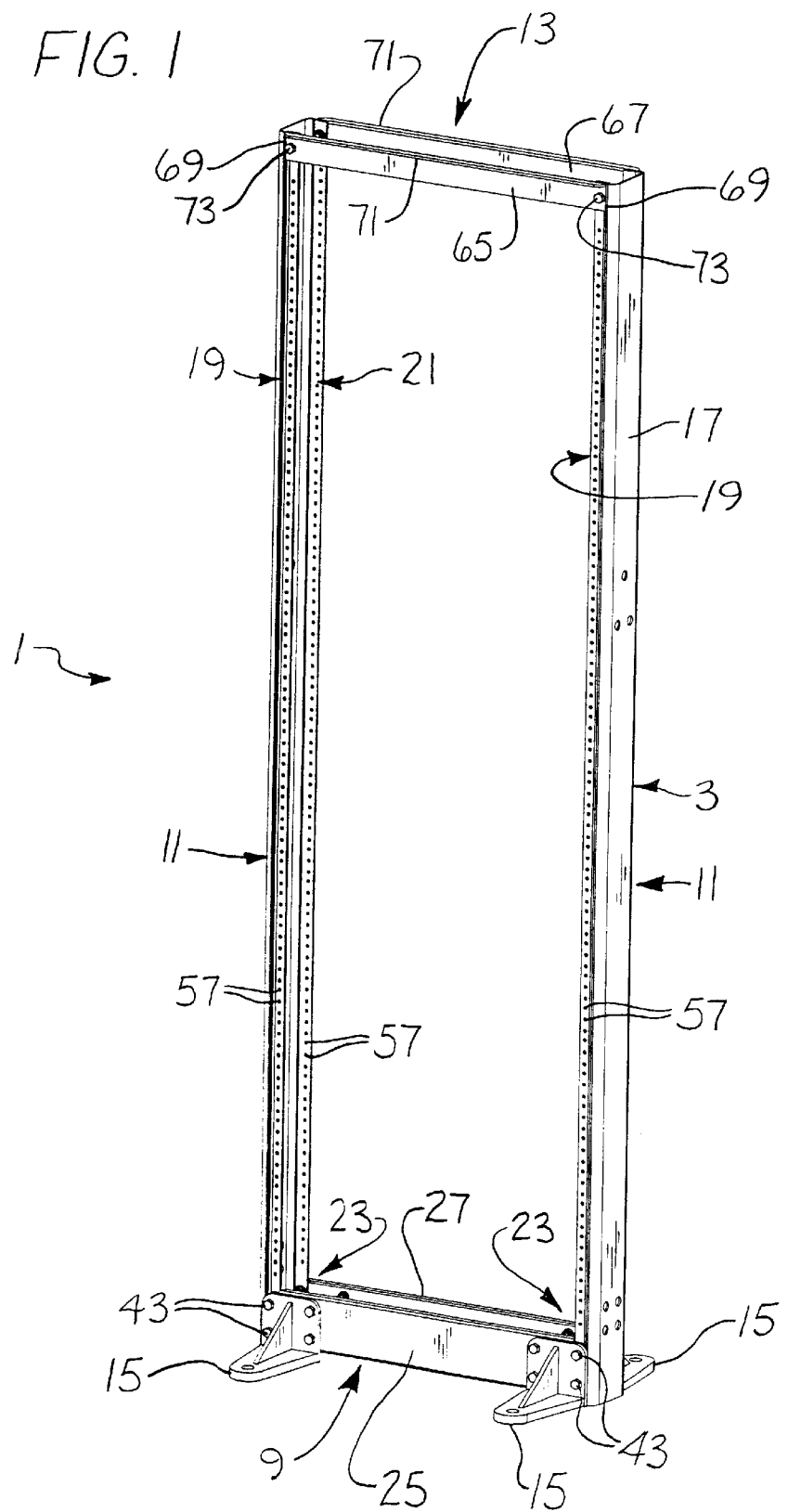

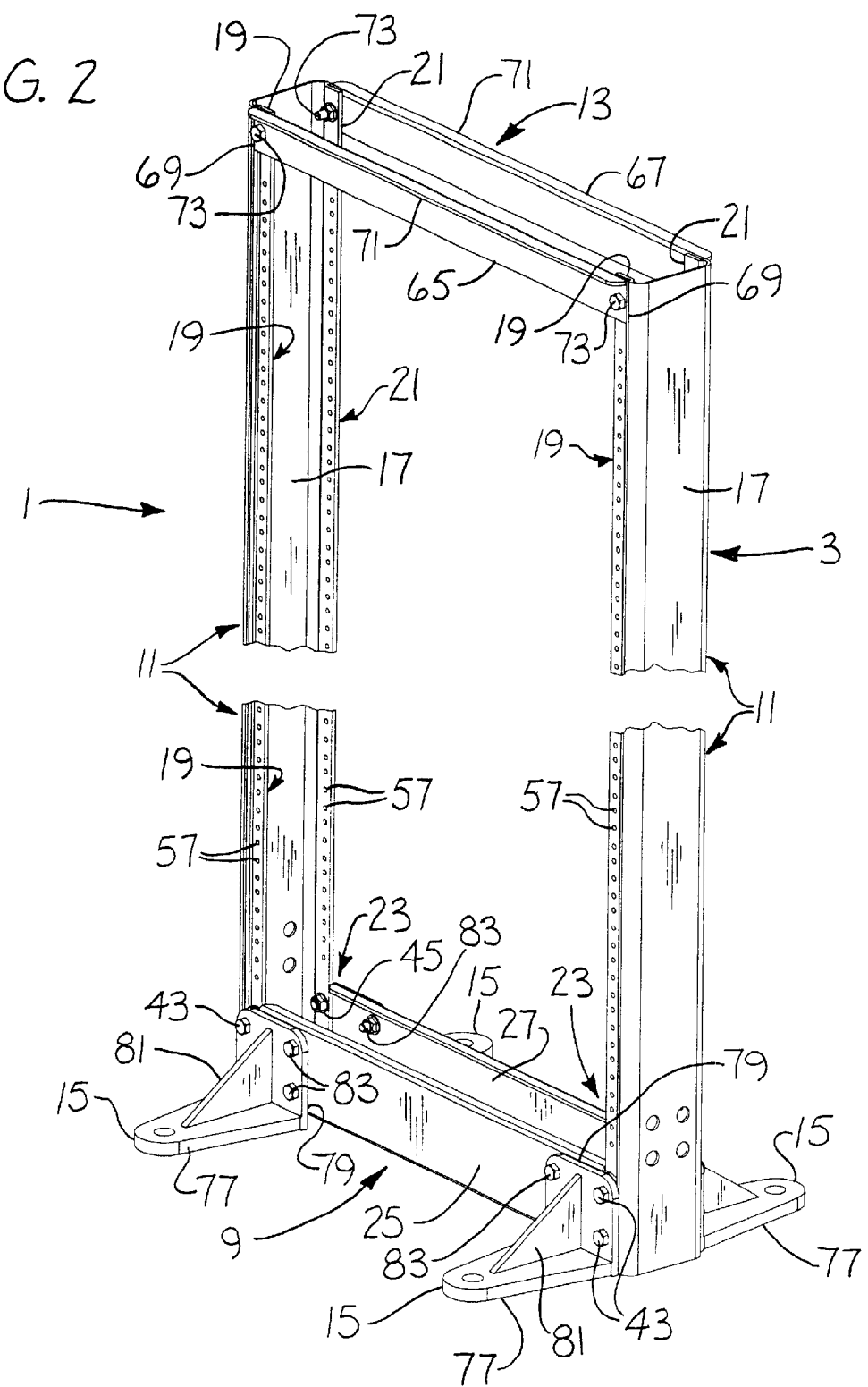

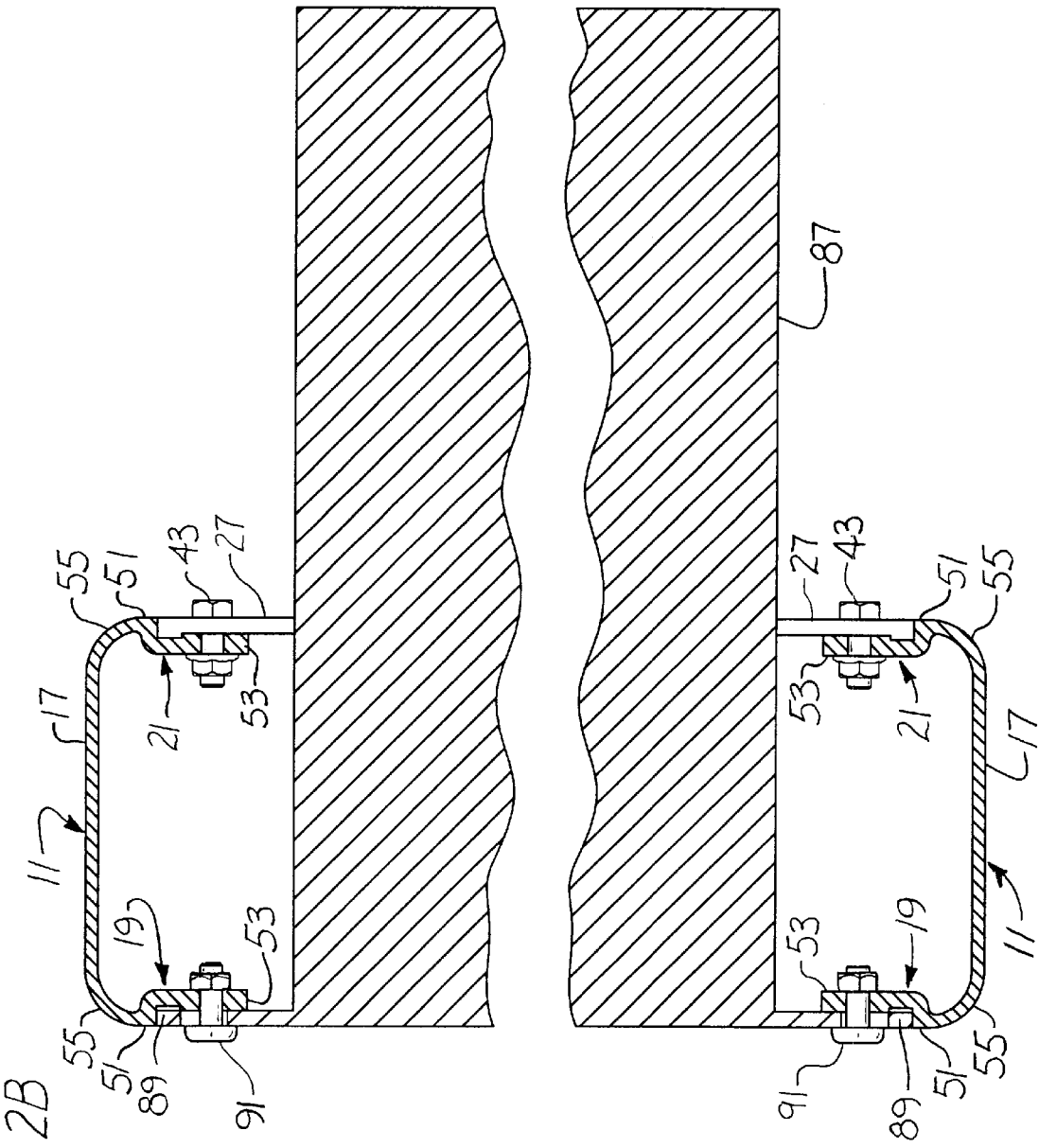

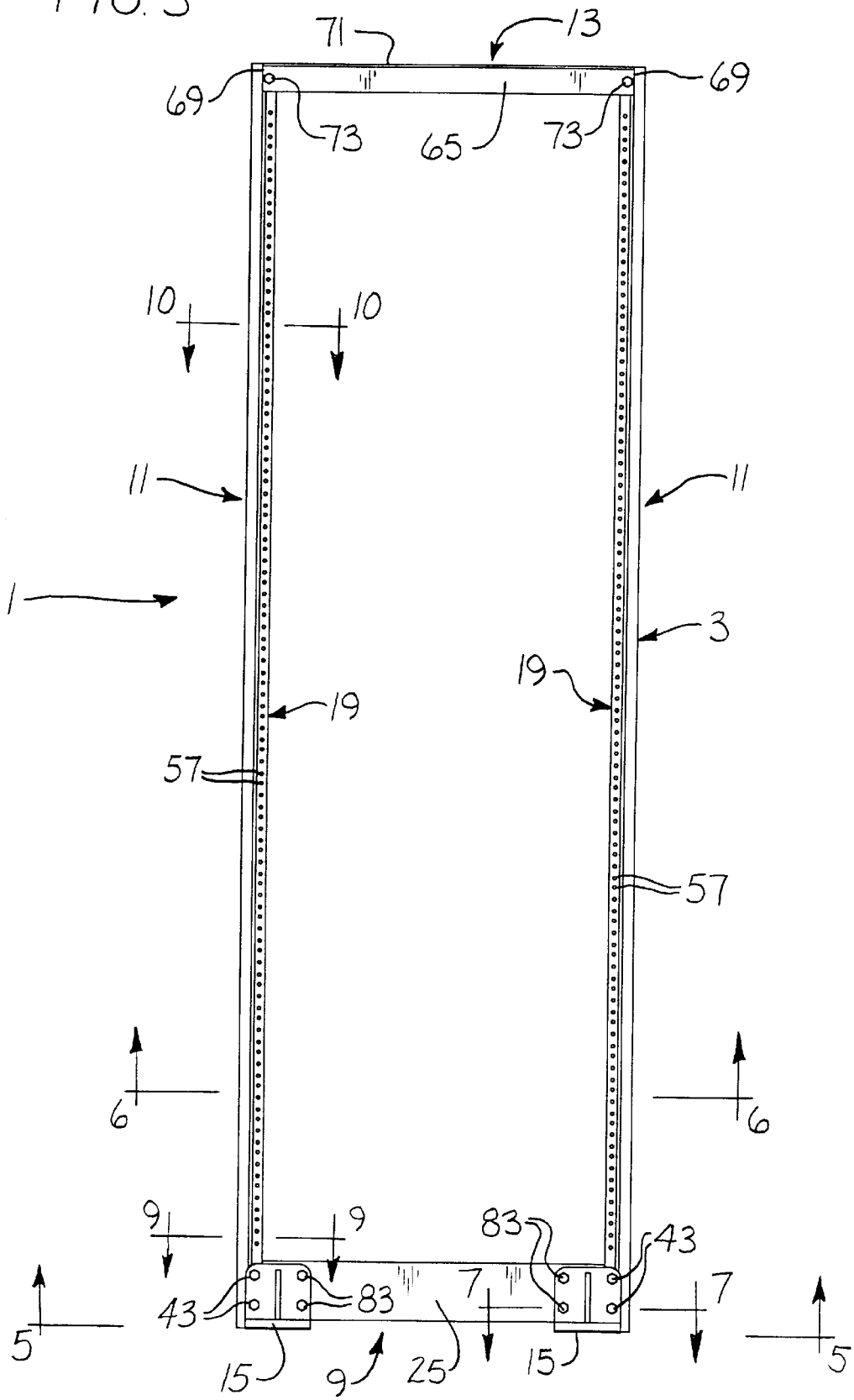

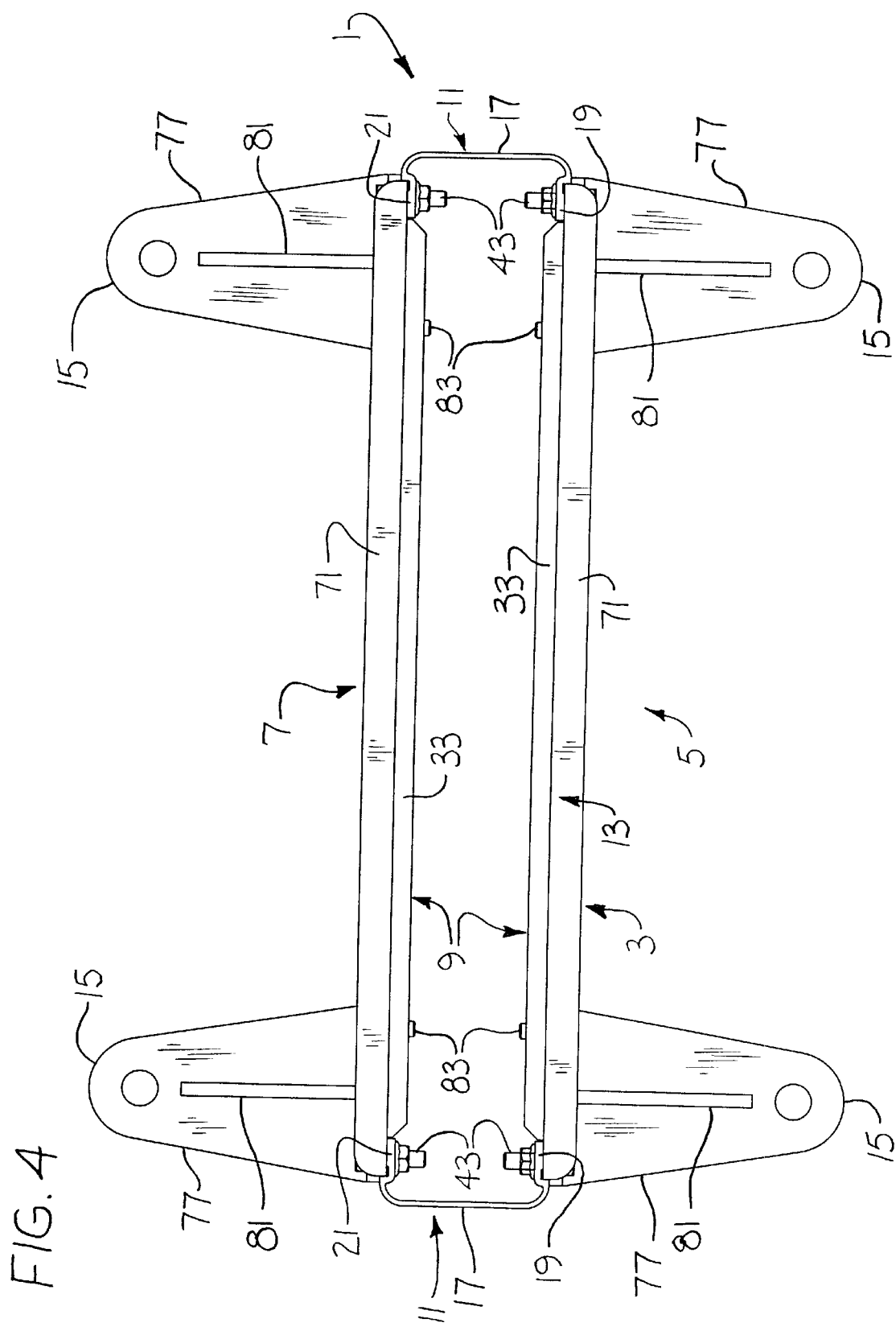

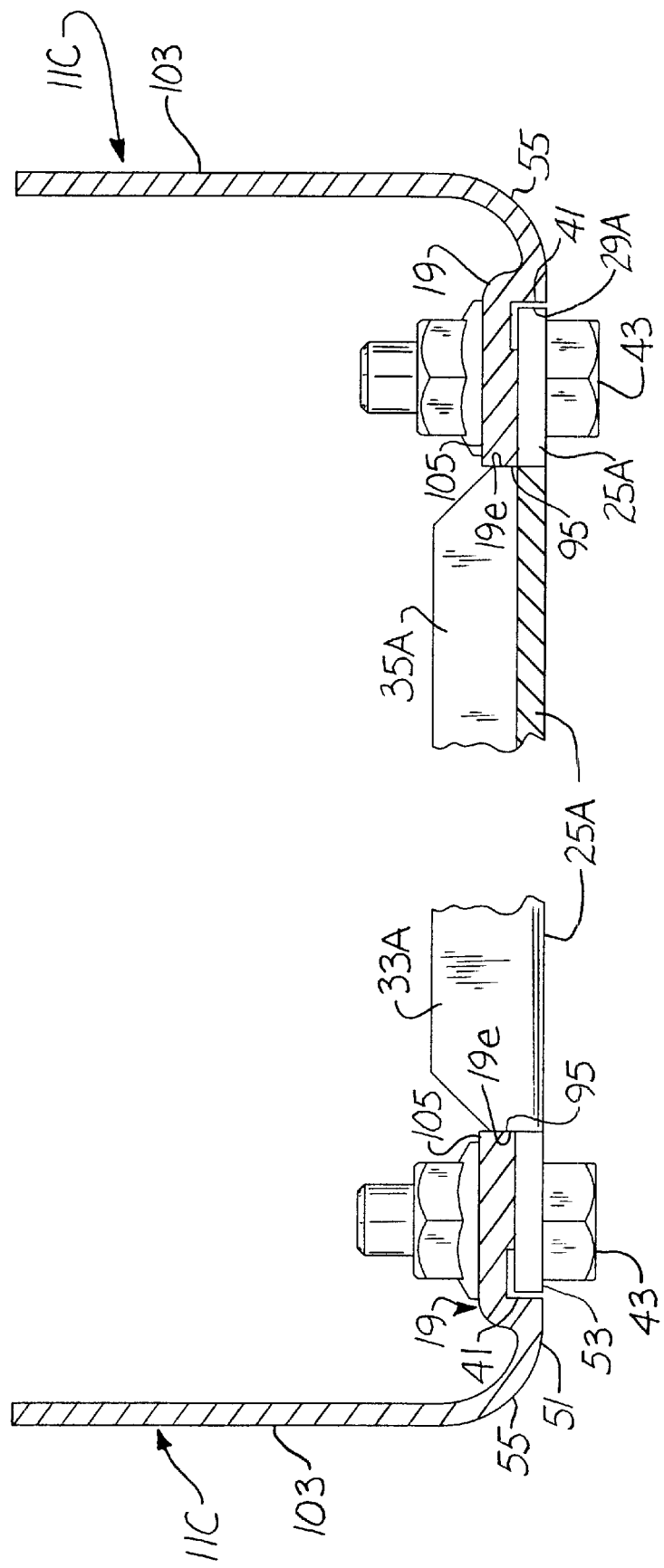

RACK

BACKGROUND OF THE INVENTION

This invention involves a rack of a type comprising an upright-standing open rectangular frame, for use especially (though not so limited) for holding units of electrical equipment in conveniently accessible orderly array one above another. Such units typically may comprise relay holders extending across the frame one above another (in which case the rack may be called a "relay rack"), or units holding electronic or electrical testing equipment, data communication equipment, telecommunication equipment (e.g. patch panels), or units in the nature of shelves for placement of such items thereon as may be desired.

Such racks are typically sold in knocked-down condition (disassembled, in a carton) with fasteners for assembly of the parts by the buyer. It is desirable that the assembly result in a frame which is substantially perfectly rectangular (i.e., substantially perfectly squared with the sides of the frame substantially perfectly vertical and the top and bottom of the frame substantially perfectly horizontal, so that the corners are substantially perfectly right-angled) and this has heretofore required extra precaution during the assembly by the buyer, such as requiring repetitive adjustments and the use of a framing square (like a carpenter's square) for proper disposition and securement of the frame parts. It is also desirable that the assembly be such that the rack as assembled is highly stable, resistant to permanent deformation of the frame should it encounter sidewise forces (including forces resulting from seismic activity). And it is further desirable that the rack holds the units of electrical equipment neatly.

SUMMARY OF THE INVENTION

Among the several objects of the invention may be noted the provision of a rack such as described comprising parts configured to be self-squaring for facilitating assembly, without need for repetitive adjustments and extraneous aids such as a framing square; the provision of such a rack which is relatively highly stable, being resistant to permanent deformation of the open rectangular frame thereof by sidewise forces; the provision of such a rack the component parts of which are of relatively light weight, relatively economical to produce, and relatively easy to assemble by the buyer; and the provision of a rack for holding units such as units of electrical equipment with the units presented in neat, orderly, pleasing manner.

In general, a rack of this invention, in a first phase thereof, comprises an open rectangular frame having first and second opposite faces. The frame comprises a base, sides, a head and feet on the base for standing it upright. Each of the sides comprises an elongate upright having in transverse cross-section a web in a plane generally perpendicular to the frame and at least a first flange extending inward from the web with respect to the frame at its first face. The base has opposite ends and the uprights extend up from the ends of the base. The base comprises at least a first elongate generally rectangular base plate spanning the first flanges at the lower ends of the uprights on the first face of the frame. The base plate has end edges extending at an angle with respect to the length of the plate. The first flanges of the uprights have squaring surfaces engageable by respective end edges of said base plate to maintain the plate and uprights in squared-up perpendicular positions relative to one another. Fasteners secure together the base plates and the uprights.

In a second phase, a rack of this invention is configured for mounting a plurality of units each having a front face and tongues at the ends thereof. The rack comprises an open rectangular frame having first and second opposite faces. The frame comprises a base, sides and a head. Each of the sides comprises an elongate upright having in transverse cross-section a web in a plane generally perpendicular to the frame and at least a first flange extending inward from the web with respect to the frame at its first face. The base has opposite ends and the uprights extend up from said ends of the base. Each of the first flanges comprises a first reach rooted in a respective web and a second reach offset inwardly with respect thereto to define a recess in an exterior surface of the flange running along substantially the full length thereof and extending from an edge of the flange in the direction toward the plane of the respective web. The recess has a depth and a bottom surface in a plane perpendicular to the respective web and terminating in an end surface. The units are adapted to be mounted on the rack one above another with the tongues of each unit fitted in the recesses of the first flanges, the tongues of each unit having thicknesses generally corresponding to the depths of the recesses whereby when the unit is mounted on the rack, the front face of the unit is generally flush with the exterior surfaces of the first reaches of the first flanges, and generally coplanar with the first face of the rack.

Other objects and features will be in part apparent and in part pointed out hereinafter.

BRIEF DESCRIPTION OF THE DRAWINGS

FIG. 1 is a perspective of a rack of this invention;

FIG. 2 is a perspective of the FIG. 1 rack on a larger scale, broken away to reduce the height of the view;

FIG. 2B is a semi-diagrammatic transverse section generally on line 2B—2B of FIG. 2A with parts omitted;

FIG. 3 is a view in elevation of one face of the rack;

FIG. 4 is a top plan;

FIG. 16 is a view similar to FIG. 11 illustrating a further modification.

Corresponding reference characters indicate corresponding parts throughout the several views of the drawings.

DETAILED DESCRIPTION OF THE PREFERRED EMBODIMENT

Figure 8:
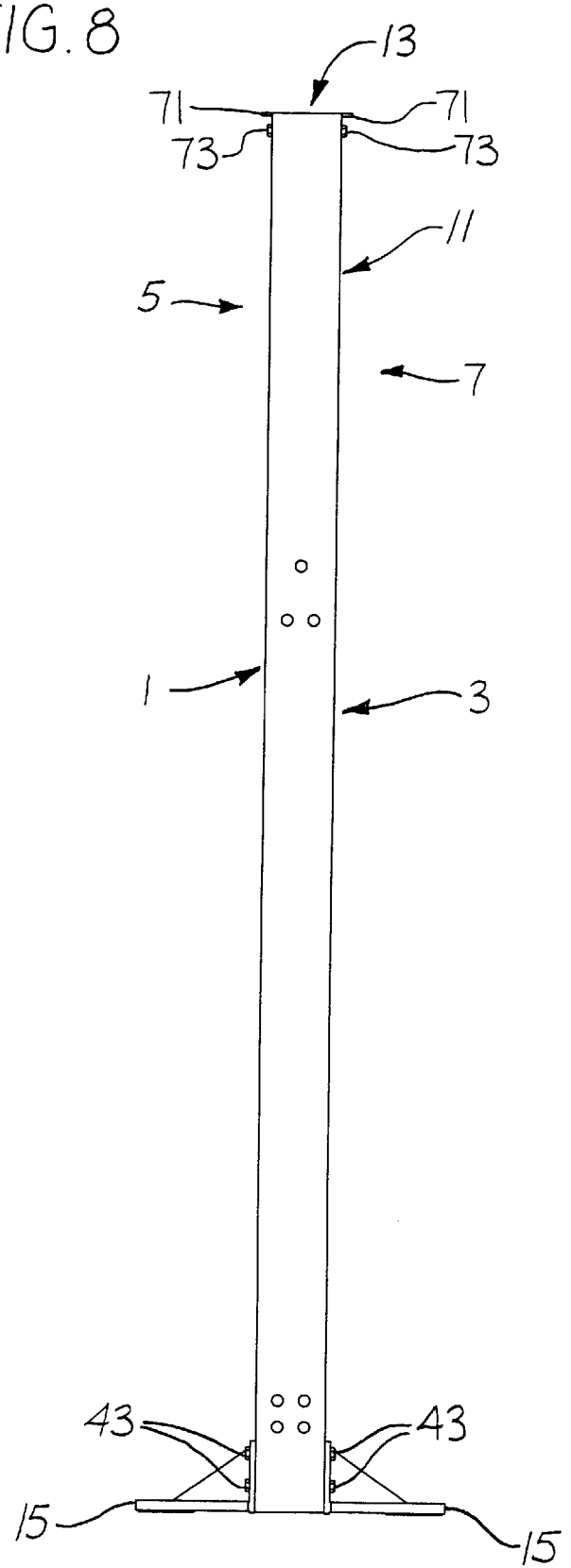
FIG. 8 is a side elevation.
Figure 9:
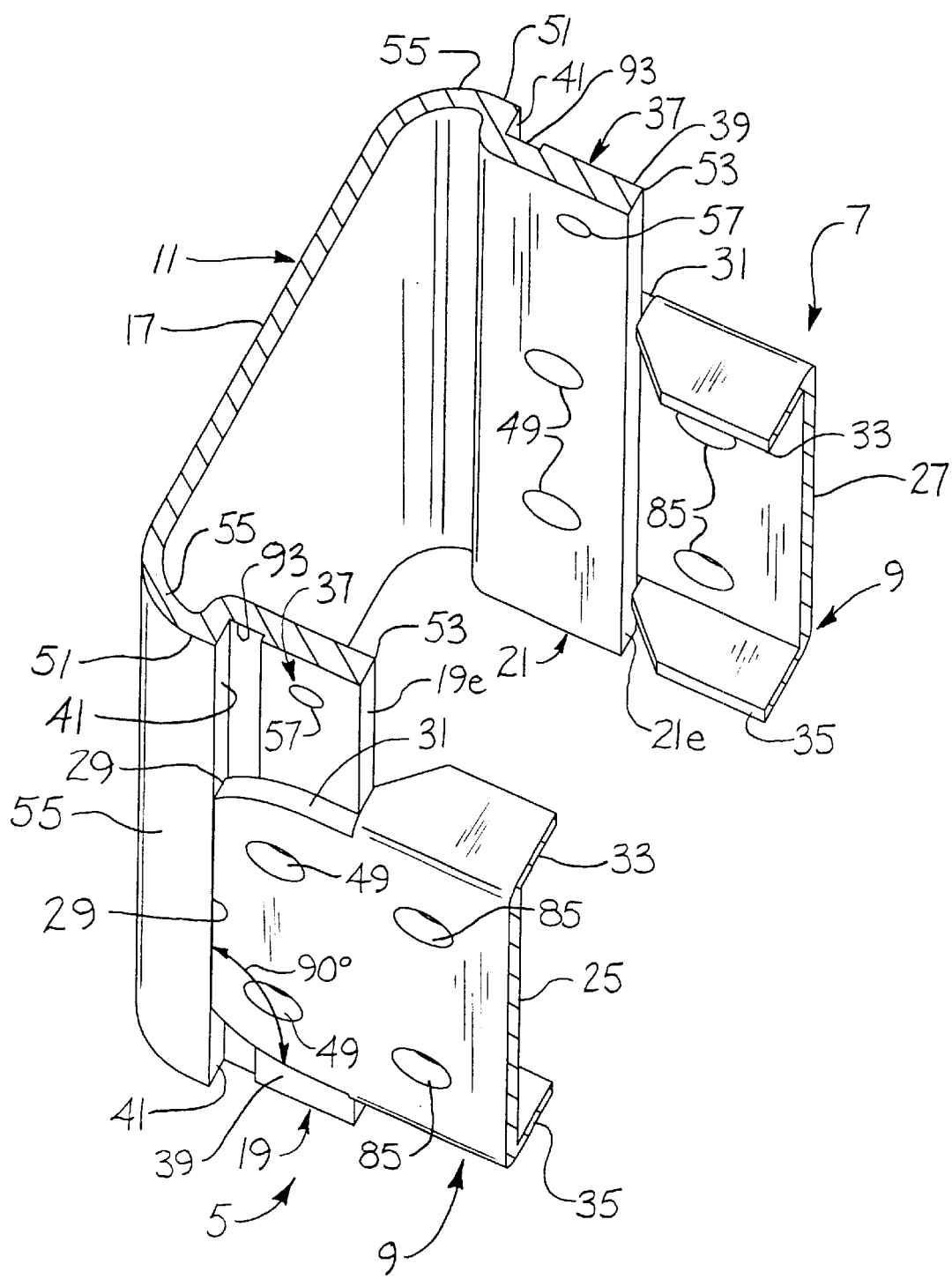
FIG. 9 is a fragmentary perspective in section on line 9—9 of FIG. 3 (enlarged), parts being omitted.
Figure 10:
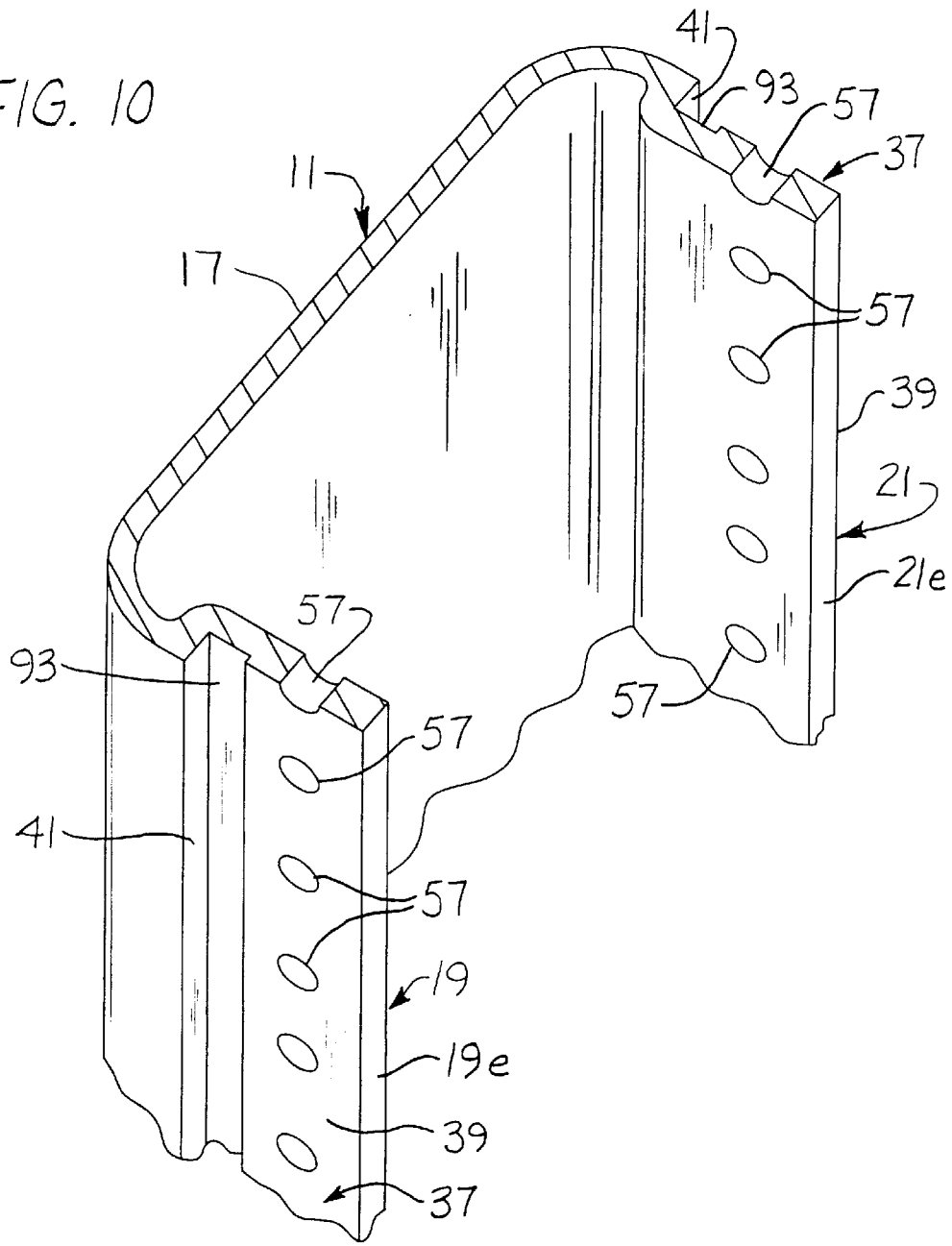
FIG. 10 is a fragmentary perspective on line 10—10 of FIG. 3 (enlarged)

Referring to FIGS. 1–10 of the drawings, a rack of this invention, designated in its entirety, is shown to comprise an open rectangular frame 3 having first and second opposite faces 5, 7 (FIGS. 4 and 8). The frame 3 comprises a base 9, sides 11 and a head 13 and has feet 15 on the base for standing it upright (as seen in FIGS. 1–3). Each of the two sides comprises an elongate upright, of generally channel shape having in transverse cross-section a web 17 in a plane generally perpendicular with respect to the frame 3, and first and second flanges 19 and 21 which extend inward from the web 17 with respect to the frame at the first and second faces 5 and 7 of the frame, respectively, the channel-section uprights or channels 11 being disposed in the frame with the open sides of the channels facing one another.

The base 9 comprises first and second elongate rectangular plates 25 and 27, the first (25) spanning the first flanges 19 at the lower ends of the uprights 11 on the first face 5 of the frame, the second plate (27) spanning the second flanges 21 at the lower ends of the uprights 11 on the second face 7 of the frame. The plates 25, 27, are identical (but reversed) each being preferably a steel plate. Its end edges are each designated 29, each edge extending at an angle of 90° (see particularly FIG. 9) with respect to the length of the plate, these edges being on end portions 31 of the plate which extend outward beyond top and bottom integral strengthening flanges 33 and 35 on the plate. The flanges 33, 35 terminate short of the ends 29 of the plate for a reason that will become apparent.

Each flange 19, 21 of each upright 11 has a recess 37 in the exterior thereof (FIG. 9) extending from the edge 19e, 21e of the flange in the direction toward the plane of the respective web 17. The recess 37 has a bottom surface indicated at 39 in a plane perpendicular to the respective web 17 and terminating short of the respective web 17 in an end surface 41 extending in a vertical plane paralleling the web 17 thus matching the 90° angle of the ends 29 of the plates 25 and 27.

The end portions 31 of the first plate 25 fit in the recesses 37 of the first flanges 19 engaging the bottom surfaces 39 of the recesses 37 of the first flanges 19. The end portions 31 of the second plate 27 fit in the recesses 37 of the second flanges 21 engaging the bottom surfaces 39 of the recesses 37 of the second flanges 21. The end surfaces 41 of the recesses 37 bound the end edges 29 of the plates 25, 27 in the manner shown in detail in FIG. 9 for the left end 29 of plate 25 and for the right end of plate 25 as appears in FIG. 7. Contiguity of end edges 29 and end surfaces 41 is a factor in assembling the base plates and the uprights with these parts at right angles to one another (i.e., with the frame squared). Fasteners, namely bolt 43 and nut 45 fasteners (with washers 47) secure together the end portions 31 of base plates 25, 27 and the uprights 11, the bolts extending through bolt holes such as indicated at 49 in the end portions 31 of the plates 25, 27 and the flanges 19, 21. The fasteners also secure the feet 15 to the base 9, as will be subsequently described.

As to each upright 11, the recesses 37 in which the end portions 31 of the base plates 25, 27 fit (squarely) are constituted by the lower ends of elongate recesses 37 in the flanges 19, 21 of the channel-section uprights 11 extending throughout the full length of the uprights (each full-length recess being akin to a rabbet). Each flange 19, 21 is formed with the full-length recess 37 by having a first reach 51, which may be termed its proximal reach, rooted in the respective web 17 and a second reach 53, which may be termed its distal reach, offset inwardly from the first reach. The web 17 of each channel-shaped upright merges into the proximal reaches 51 via curved transitions 55. Each of the channel-section uprights 11 (they are identical, being reversed in position) preferably comprises a long length of an aluminum extrusion and each of the base plates 25, 27 is preferably a steel plate. Two bolts 43 are used to fasten each plate end portion 31 to the respective flange 19, 21, these bolts (and the bolt holes therefor) being disposed one directly above another. The distal reach 53 of each flange 19, 21 has a series of bolt holes 57 therein, the holes 57 being spaced at intervals between the upper and lower ends of the flanges. The holes 57 are receptive of fasteners (screws) 91 for securing units such as units of electrical equipment to the rack one above another (see FIG. 2A).

The head 13 comprises first and second elongate rectangular plates 65 and 67, the first (65) spanning the first flanges 19 at the upper ends of the uprights 11 on the first face 5 of the frame and the second plate (67) spanning the second flanges 21 at the upper ends of the uprights 11 on the second face 7 of the frame. Each plate 65, 67, preferably a steel plate, has its end edges (each designated 69 in FIG. 3) extending at an angle of 90° with respect to the length of the plate. Each plate 65, 67 has a top integral strengthening flange 71 extending outwardly with respect to the frame.

End portions of the first head plate 65 fit in the recesses 37 of the first flanges 19 at the upper ends of channels 11 engaging the bottom surfaces 39 of the recesses 37 of the first flanges 19. End portions of the second head plate 67 fit in the recesses 37 of the second flanges 21 at the upper ends of channels 11 engaging the bottom surfaces 39 of the recesses 37 of the second flanges 21. The end surfaces 41 of the recesses 37 bound the end edges of the head plates 65, 67 in the manner shown in FIG. 6. Contiguity of the end edges and end surfaces 41 is a factor in assembling the head plates 65, 67 and the uprights 11 with these parts at right angles to one another (i.e., with the frame squared). Fasteners, namely bolt 73 and nut 75 fasteners (with washers) secure together end portions of head plates 65, 67 and the uprights 11.

The rack has four feet 15, one at each end of the base on face 5, and one at each end of the base on face 7. Each foot 15 is constituted by a relatively triangular metal part 77, having the bottom or "sole" formation shown in FIG. 5 (not critical) and having an upwardly extending leg 79 at one end (its wide end) with an integral gusset 81 for bracing purposes. Each leg is fastened to the respective base plate 25, 27 by the fasteners 43, which are located outwardly of the respective gusset, also being fastened to the respective base plate 25, 27 inwardly of the respective gusset by bolts 83 extending through bolt holes 85.

Figure 2A:
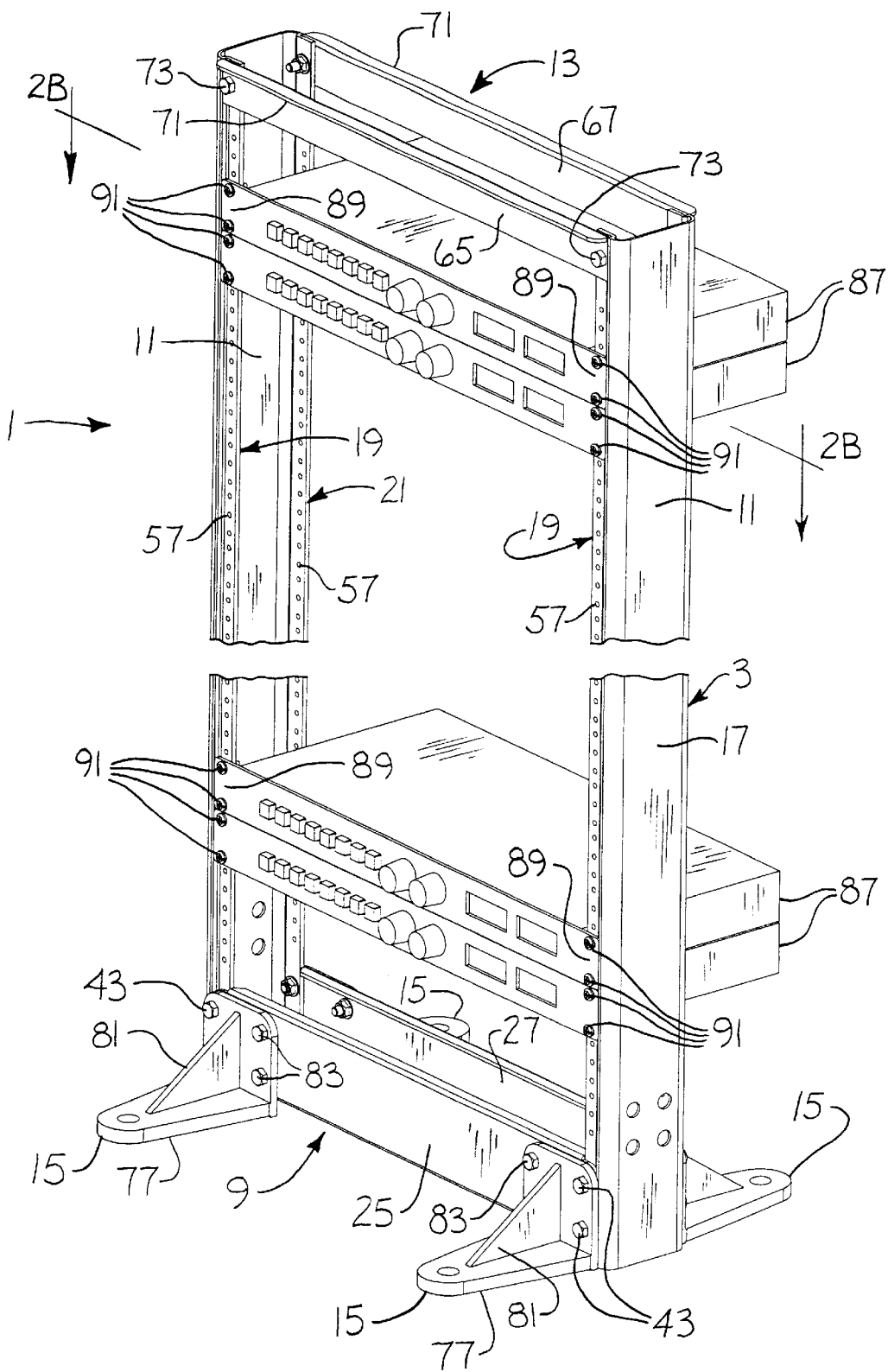
FIG. 2A is a perspective similar to FIG. 2 showing units of electrical equipment installed on the rack.
Figure 5:
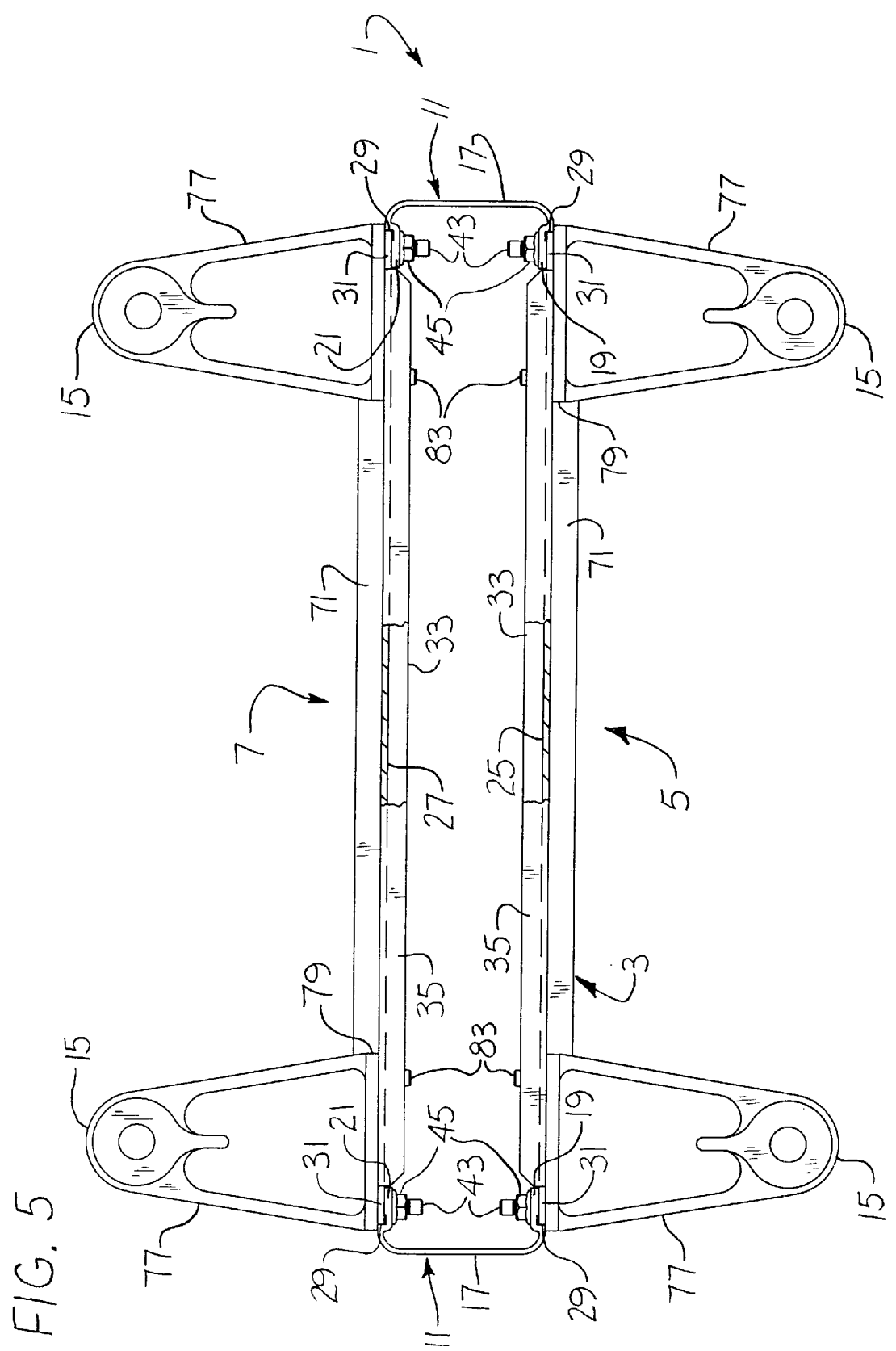
FIG. 5 is a bottom plan (on line 5—5 of FIG. 3) on a larger scale than FIG. 3, parts being broken away.
Figure 6:
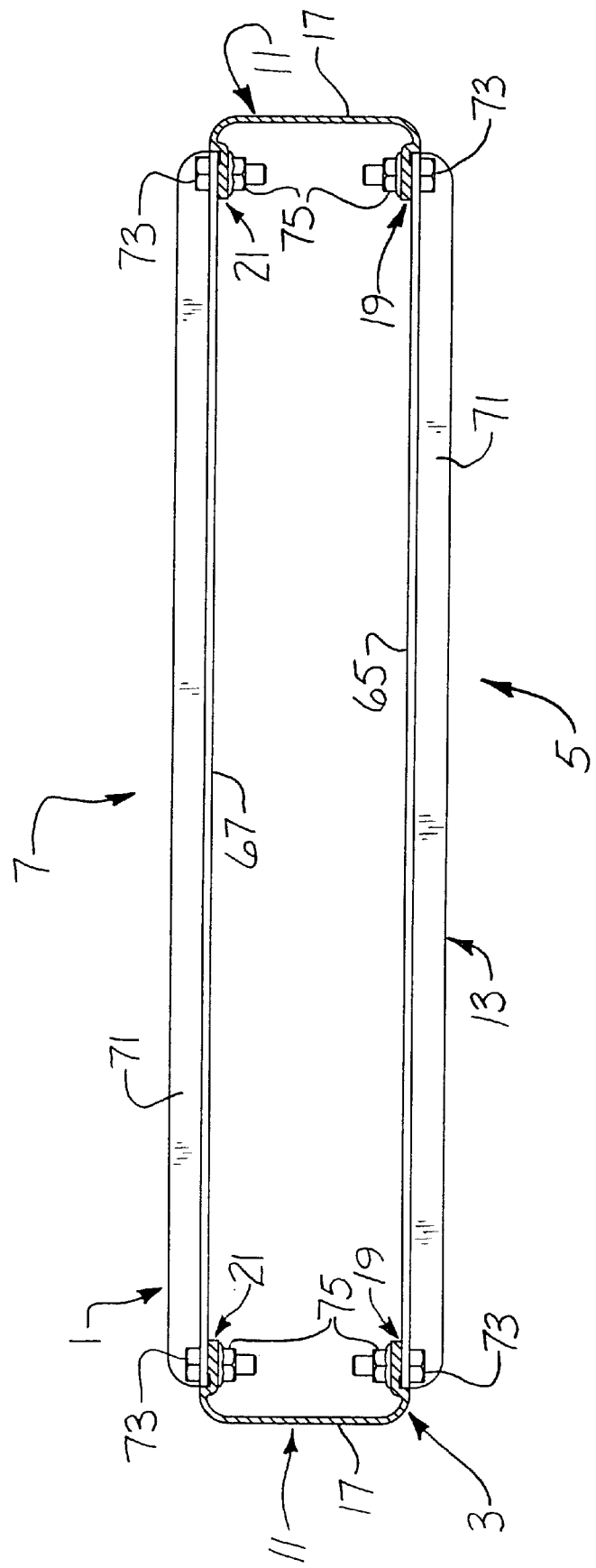
FIG. 6 is a transverse section looking up on line 6—6 of FIG. 3.
Figure 7:
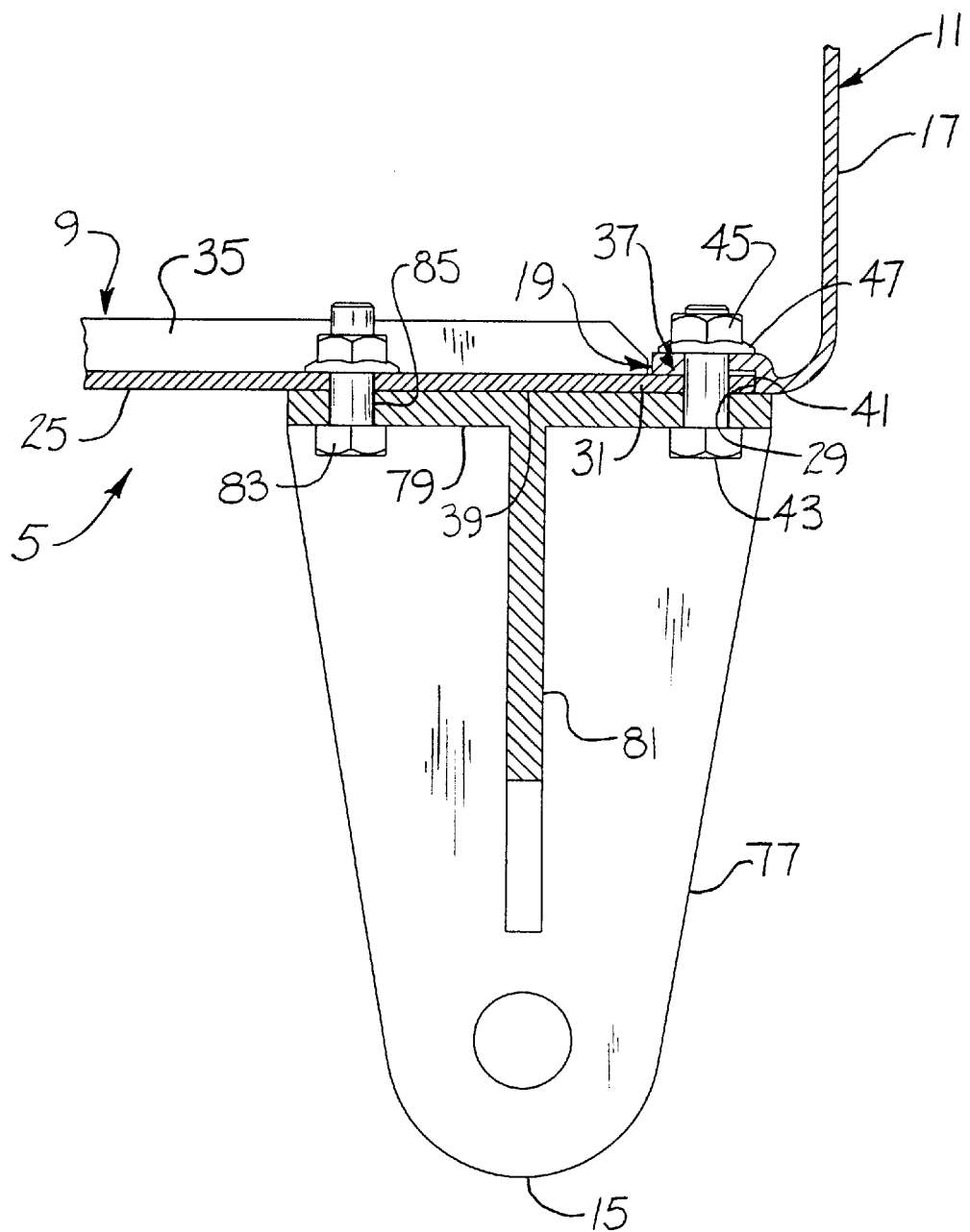
FIG. 7 is an enlarged section on line 7—7 of FIG. 3.

FIG. 2A shows the rack 1 with units 87 such as typical electronic equipment units mounted thereon (within frame 3) one above another. The units typically have extensions 89 of the front plate (tongues) projecting outwardly endwise at each end thereof lodged in recesses 37 of the flanges 19 of the uprights 11 (the front flanges in this set-up) and fastened to the uprights by screw fasteners such as indicated at 91 (see also FIG. 2B). As shown in FIG. 2B, the thickness of the extensions 89 is preferably about the same as the depth of the recesses 37 so that the outer surfaces of the extensions are flush (coplanar) with adjacent outer surfaces of respective flanges 19, 21 to provide a pleasing finished appearance.

The rack 1 is typically sold in knocked-down condition (disassembled in a carton with bolts for fastening the feet 15 and base plates 25, 27 to the lower ends of the uprights 11 and for fastening the header plates 65, 67 to the upper ends of the uprights) for assembly by the buyer. The uprights 11, base plates 25, 27 feet 15 and head plates 65, are adapted to be readily assembled and fastened together in substantially squared conformation (uprights 11 substantially vertical, base plates 25, 27 and header plates 65, 67 substantially horizontal) without repetitive adjustments and without having to use a framing square (for example). Assembly is carried out by positioning the end portions 31 of the base plates 25, 27 in the recesses 37 with the end edges 29 of the base plates engaging the end surfaces 41 of the recesses, positioning end portions of the header plates 65, 67 in the recesses 37 at the upper ends with the end edges 69 of the header plates 65, 67 engaging the end surfaces 41 of the recesses, applying the feet 15 and fastening the parts together.

Not only is the assembly of the component parts of the rack 1 in squared-up conformation simplified for the buyer, with the bolts tightened the rack as it stands is very stable, maintaining its posture if pushed sidewise and in the event it is subjected to seismic activity. The manner in which the units 87 are mounted in the rack (with their end extensions 89 fitted in the recesses 37 of the uprights 11) contributes to its strength and stability. The parts are such that they may be made of relatively light weight material thus contributing to relatively low parts cost, relatively low shipping cost, and relative ease in handling. Grooves such as indicated at 93 in FIG. 9 may be provided in the uprights if they are to be painted, to avoid fillets of paint where they would interfere with the fit. If the uprights 11 are extruded members, which is preferred to reduce cost and provide greater dimensional accuracy, the grooves 93 also remove any rounded extruded fillets at the junctures of the end surfaces 41 and bottom surfaces 39 to provide a close flat fit between the end edges 29 of the plates 25, 27 and the end surfaces 41 of the recesses 37.

To insure that the parts are enabled to be assembled as above described with the resultant rack substantially squared, so that the holes in the units 87 which are to be mounted on the rack (the "rack-mounted" units) match up with holes 57 in the uprights 11, the component parts of the rack are made to accurate dimensions. In this regard, the distance (the horizontal distance) between each edge 29 of each base plate 25, 27 and the centerline of the adjacent bolt holes 49 in the plate and between each edge of each header plate 65, 67 and the centerline of the adjacent bolt hole 49 in the respective plate matches the distance between the end surface 41 of the respective recess 37 and centerline of the respective bolt holes 49 in the respective flange with close tolerance. For example, this tolerance may be 0.030 inch maximum and preferably 0.005–0.010 inch, and the tolerance for the bolt holes 49 (for 0.25 inch bolts) may be 0.010–0.015 inch. These tolerances can be readily achieved by fabricating the uprights 11 as extruded parts, for example, and by precisely cutting the base plates 25, 27 and header plates 65, 67 from suitable structural metal bar stock. Other methods of fabrication are also feasible.

As noted, the angles of the end surfaces 41 of the recesses 37 should match the angles of the end edges 29 of the base plates 25, 27 and the header plates 65, 67 to ensure that the rack is "square" after assembly. While the matching angles are shown in the drawings as being 90 degree angles, it will be understood that the angles may be other than 90 degrees so long as the edges and surfaces are in parallel, substantially contiguous, abutting, face-to-face relation to provide the required close dimensional fit.

Figure 11:
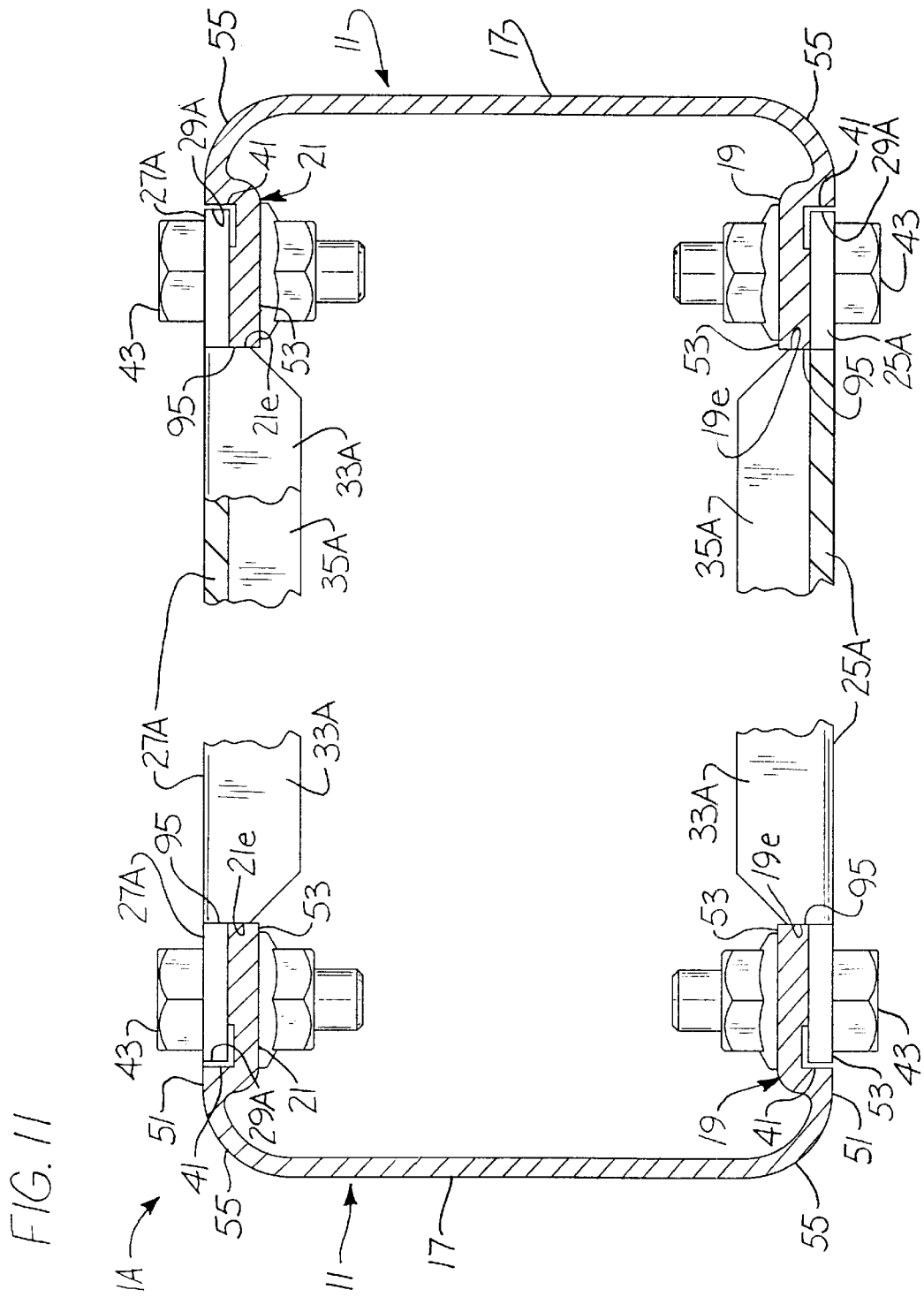
FIG. 11 is a transverse horizontal section, broken away in the middle to reduce the length of the view and partly additionally broken away and shown in section, illustrating a modified version of the rack.
Figure 12:
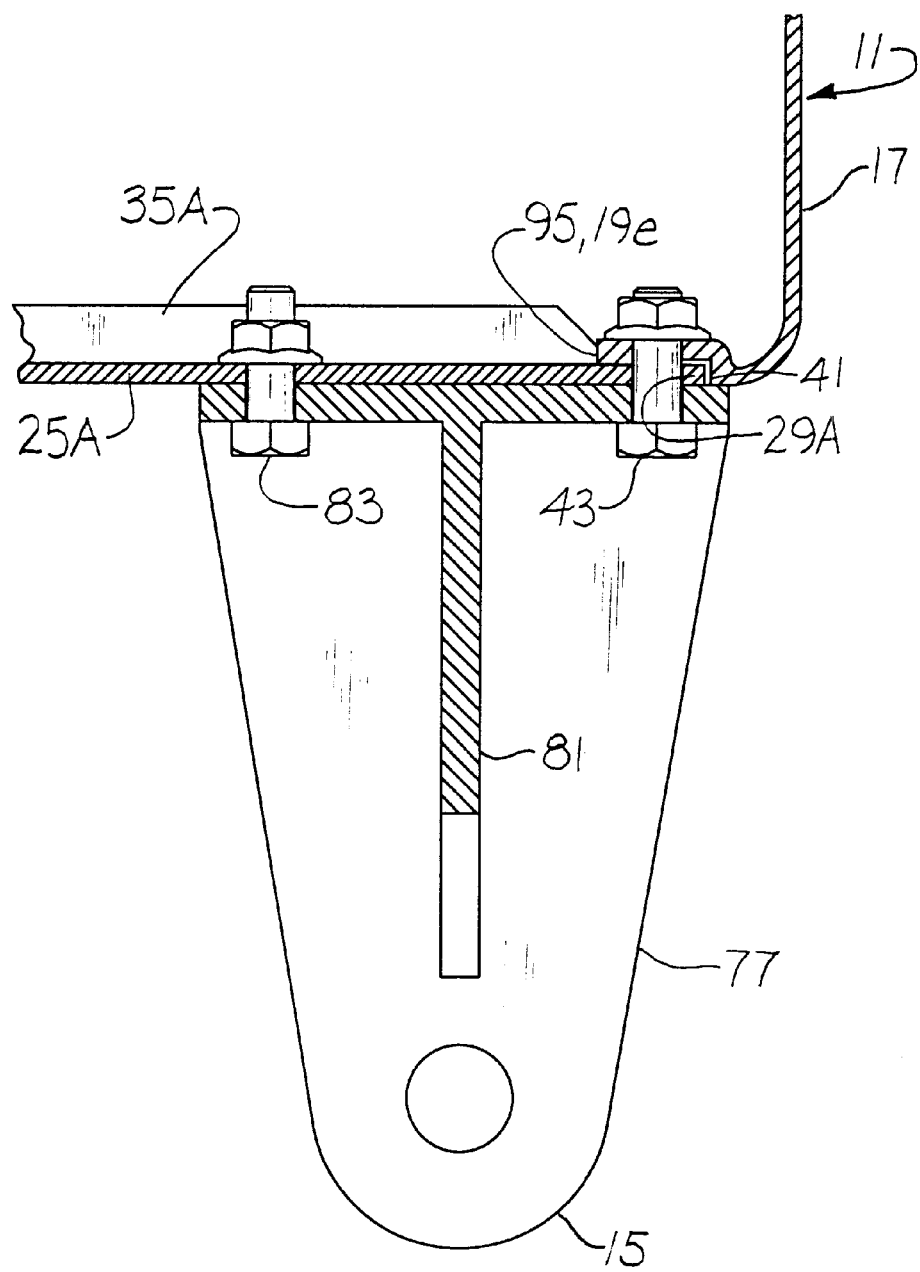
FIG. 12 is an enlarged fragment of FIG. 11, being of the format of FIG. 7.

FIGS. 11 and 12 illustrate a modified version of the rack as above described, designated in its entirety by the reference character 1A to distinguish it from rack 1. Rack 1A corresponds in large measure to rack 1 (with the same reference characters indicating corresponding parts) but differs from the rack 1 in that the base plates, designated 25A and 27A, are modified by making their top and bottom flanges 33A, 35A somewhat longer with end edges 95 thereof at right angles thereto. These end edges 95 of the base plate flanges abut edges 19e, 21e of the uprights 11, said edges 19e, 21e thereby constituting squaring surfaces engageable by respective end edges 95 to maintain the base plates and uprights in squared-up perpendicular positions relative to one another. Base plate edges 29A are spaced a slight distance from end surfaces 41 of recesses 37.

Figure 13:
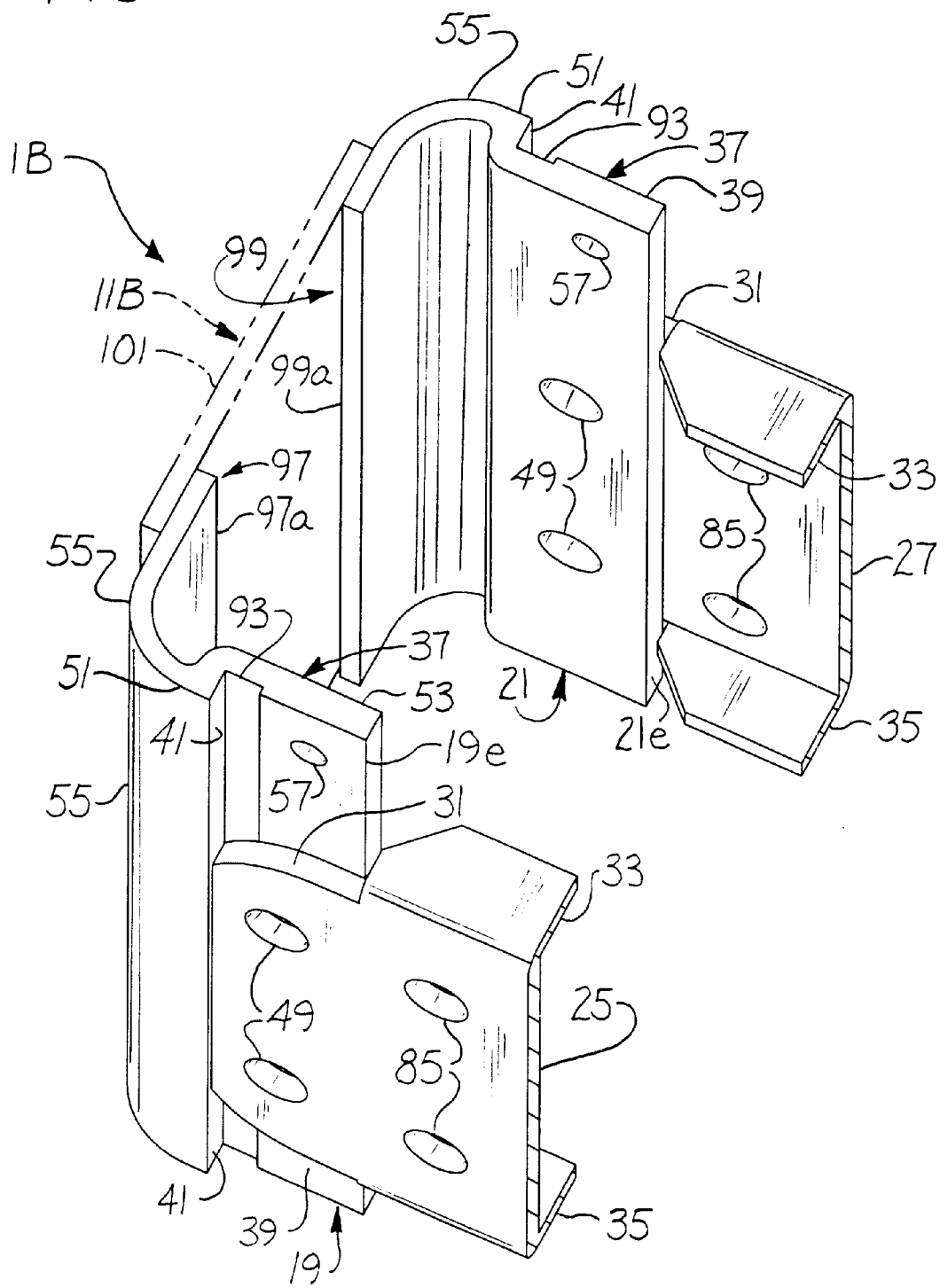
FIG. 13 is a view similar to FIG. 9 illustrating another modification.

FIG. 13 illustrates another modification of the rack, designated 1B in its entirety, wherein each upright designated 11B, instead of being a one-piece channel 11, is in effect a two-piece channel comprising two angles 97 and 99 suitably secured together with legs 97a, 99a thereof in alignment as indicated in phantom at 101, the legs 97a, 99a in effect constituting a web of the upright. Otherwise, rack 1B is essentially of the same construction as the rack 1.

Figure 14:
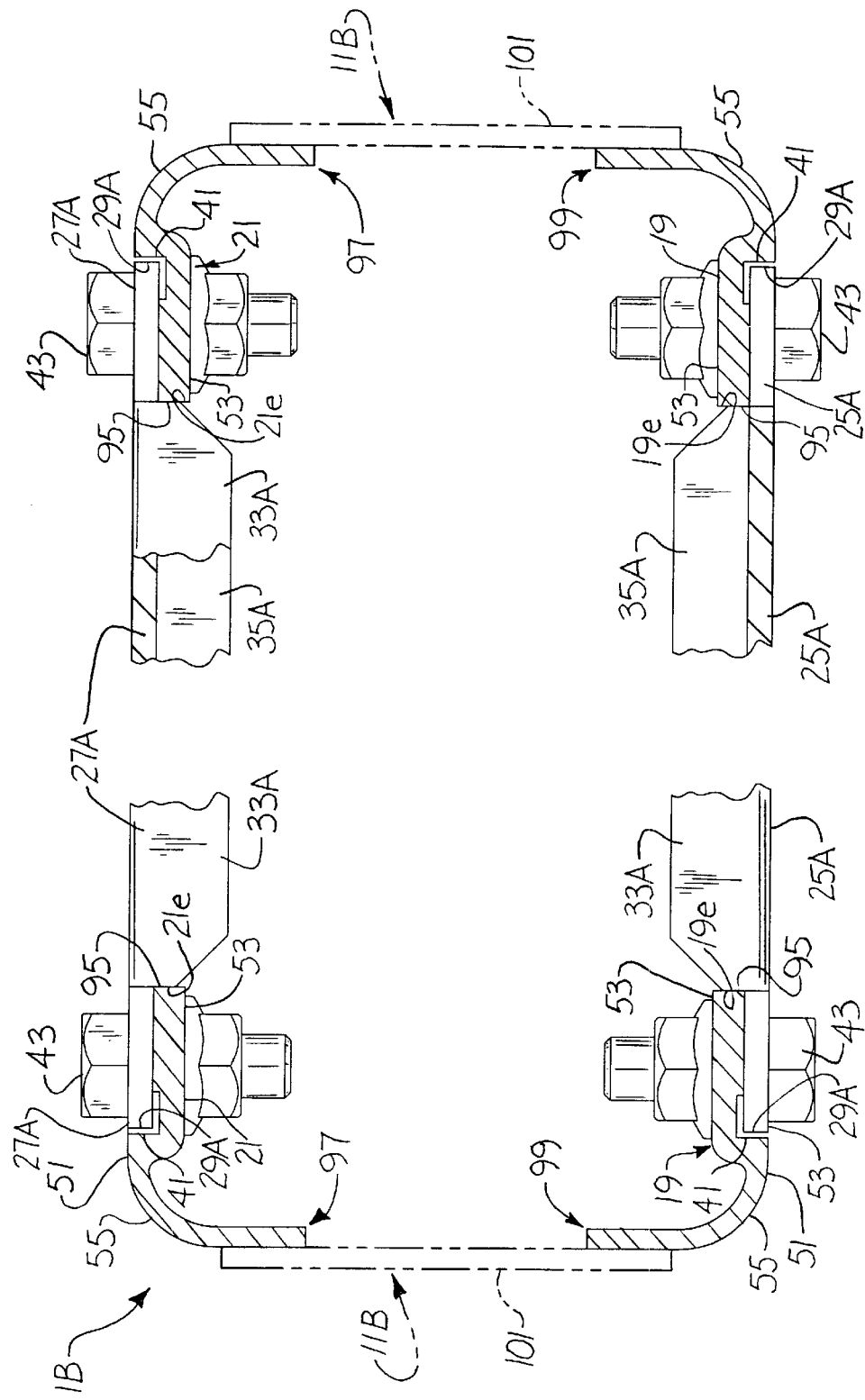
FIG. 14 is a view similar to FIG. 11 illustrating another modification.

FIG. 14 illustrates a modification of the FIG. 13 rack wherein each upright 11B comprises the two angles 97, 99 and wherein the squaring is the same as in FIGS. 11 and 12.

Figure 15:
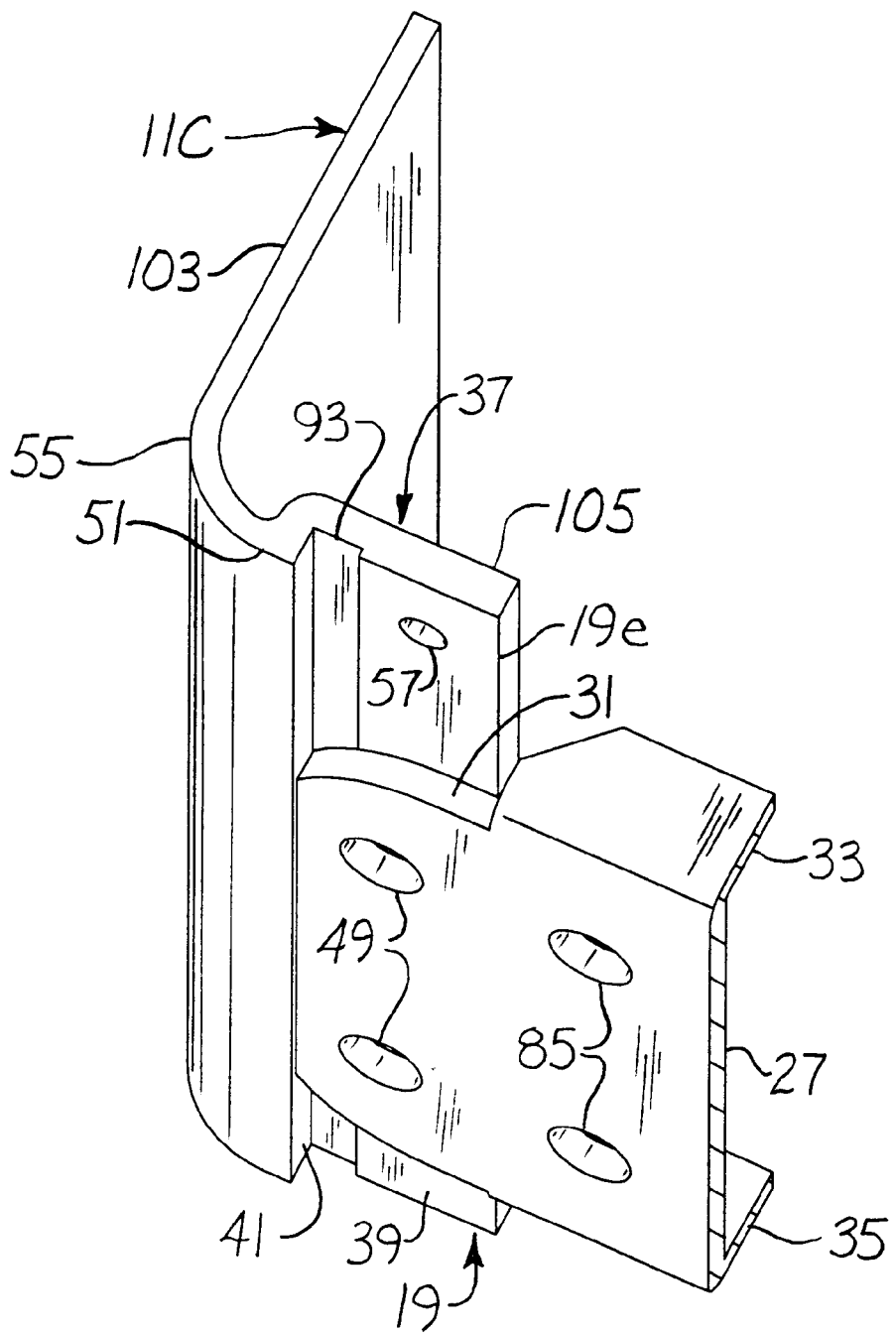
FIG. 15 is a view illustrating yet another modification.

FIG. 15 illustrates a modification wherein each upright (here designated 11C) is constituted by a member generally of L-shape in transverse section having a leg 103 constituting what amounts to the web of the upright and a leg 105 constituting what amounts to the flange of the upright. Here there is only one base plate 27 and the rack is a single-face rack, the legs and base plate being at the front of the rack. The squaring is the same as in FIG. 7.

FIG. 16 illustrates a modification like that of FIG. 15 except that the squaring is the same as in FIGS. 11 and 12.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A rack comprising an upright open rectangular frame having first and second opposite faces, said frame comprising a base, sides and a head, each of the sides comprising an elongate upright having in transverse cross-section a web in a plane generally perpendicular to the frame and at least a first flange extending inward from the web with respect to the frame at its first face, said base having opposite ends and said uprights extending up from said ends of the base, said base comprising at least a first elongate generally rectangular base plate spanning the first flanges at the lower ends of the uprights on the first face of the frame, said base plate having end edges extending at an angle with respect to the length of the plate, said first flanges of said uprights having squaring surfaces engageable by respective end edges of said base plate to maintain the plate and uprights in squared-up perpendicular positions relative to one another, and fasteners securing together the base plate and the uprights.

2. A rack as set forth in claim 1 wherein each of said first flanges has a recess in the exterior thereof at its lower end extending from the edge of the flange in the direction toward the plane of the respective web, said recess having a bottom surface in a plane perpendicular to the respective web and terminating in one of said squaring surfaces extending at a matching angle relative to said angle of a respective end edge of the base plate, end portions of the base plate fitting in the recesses of the first flanges and engaging the bottom surfaces of the recesses of the first flanges, said squaring surfaces of the recesses bounding the end edges of the plates.

3. A rack as set forth in claim 2 wherein said angle is a 90° angle, said end edges of the base plate matching said squaring surfaces of the recesses.

4. A rack as set forth in claim 3 wherein said recesses are constituted by the lower ends of elongate recesses in the first flanges of the uprights extending the length of the uprights.

5. A rack as set forth in claim 4 wherein each first flange is formed with the respective recess by having a first reach rooted in the respective web and a second reach offset inwardly with respect thereto.

6. A rack as set forth in claim 1 wherein each first flange has a series of holes spaced at intervals all along its length.

7. A rack as set forth in claim 6 wherein the holes are in the second reaches of the flanges.

8. A rack as set forth in claim 7 wherein each upright comprises a length of a metal extrusion.

9. A rack as set forth in claim 8 wherein each upright is a length of an aluminum extrusion and said base plate is a steel plate.

10. A rack as set forth in claim 1 wherein said fasteners are constituted by bolts extending through bolt holes in the base plate and said first flanges of the uprights.

11. A rack as set forth in claim 10 wherein bolts are disposed one above another at each end of the base plate.

12. A rack as set forth in claim 11 wherein the bolts also fasten feet on the base.

13. A rack as set forth in claim 12 further comprising feet at opposite ends of the base fastened to the base plate by respective bolts.

14. A rack as set forth in claim 13 wherein each upright is in the form of a channel having a second flange generally parallel to said first flange, and wherein said base comprises a second elongate generally rectangular base plate spanning the second flanges adjacent the lower ends of the uprights on the second face of the rack, said second base plate having end edges, each of said second flanges having a recess in the exterior thereof at its lower end extending from the edge of the flange in the direction toward the plane of the respective web, said recess having a bottom surface in a plane perpendicular to the respective web and terminating in a squaring surface extending at a matching angle relative to said angle of a respective end edge of the second base plate, end portions of the second base plate fitting in the recesses of the second flanges and engaging the bottom surfaces of the recesses of the second flanges, said squaring surfaces of the recesses bounding the end edges of the second base plate.

15. A rack as set forth in claim 1 wherein the head of the frame comprises at least at least one elongate generally rectangular head plate spanning the first flanges at the upper ends of the uprights on the first face of the frame, said first flanges of each upright having squaring surfaces engageable with respective end edge of said head plate to maintain the head plate and uprights in squared-up perpendicular positions relative to one another, and fasteners securing together the head plate and the uprights.

16. A rack as set forth in claim 15 wherein each of said first flanges of the uprights has a recess in the exterior thereof at its upper end extending from the edge of the flange in the direction toward the plane of the respective web, said recess having a bottom surface in a plane perpendicular to the respective web and terminating in one of said squaring surfaces extending at a matching angle, end portions of the head plate fitting in the recesses of the first flanges and engaging the bottom surfaces of the recesses of the first flanges and end portions, said squaring surfaces of the recesses bounding the end edges of the head plate.

17. A rack as set forth in claim 16 wherein each said angle is a 90° angle, said end edges of the head plate matching said squaring surfaces of the recesses.

18. A rack as set forth in claim 16 wherein said recesses are constituted by the lower and upper ends of elongate recesses in the first flanges of the uprights extending the length of the uprights.

19. A rack as set forth in claim 18 wherein each first flange is formed with the respective recess by having a first reach rooted in the respective web and a second reach offset inwardly with respect thereto.

20. A rack as set forth in claim 15 wherein each first flange has a series of holes spaced at intervals all along its length.

21. A rack as set forth in claim 20 wherein the holes are in the second reaches of the flanges.

22. A rack as set forth in claim 21 wherein each upright comprises a length of a metal extrusion.

23. A rack as set forth in claim 22 wherein each upright is a length of an aluminum extrusion and each head plate is a steel plate.

24. A rack as set forth in claim 15 further comprising fasteners constituted by bolts extending through bolt holes in the base and head plates and said first flanges of the uprights.

25. A rack as set forth in claim 1 wherein the first flanges terminate in end edges constituting said squaring surfaces.

26. A rack as set forth in claim 25 wherein said first base plate has at least one flange along an upper or lower edge thereof terminating in said end edges short of the ends of the plate for engagement with said squaring surfaces of respective first flanges.

27. A rack comprising an open rectangular frame having first and second opposite faces, said frame comprising a base, sides and a head, each of the sides having in transverse cross-section a web in a plane generally perpendicular to the frame and first and second flanges extending inward from the web with respect to the frame at its first and second faces, respectively, said base having opposite ends and said channels extending up from said ends of the base, said base comprising first and second elongate generally rectangular plates, the first plate spanning the first flanges at the lower ends of the uprights on the first face of the frame and the second plate spanning the second flanges at the lower ends of the uprights on the second face of the frame, each plate having end edges extending at substantially a 90° angle with respect to the length of the plate, each flange having an elongate recess in the exterior thereof for the full length thereof extending from the edge of the flange in the direction toward the plane of the respective web, said recess having a bottom surface in a plane perpendicular to the respective web and terminating in a squaring surface extending at substantially a 90° angle, end portions of the first plate fitting in the lower ends of the recesses of the first flanges and engaging the bottom surfaces of the recesses of the first flanges and end portions of the second plate fitting in the recesses of the lower ends of the second flanges and engaging the bottom surfaces of the recesses of the second flanges, said squaring surfaces of the recesses bounding the end edges of the plates, fasteners securing together the end portions of the first and second plates and the channels, the head of the frame comprising third and fourth elongate generally rectangular plates, the third plate spanning the first flanges at the upper ends of the channels on the first face of the frame and the fourth plate spanning the second flanges at the upper ends of the channels on the second face of each flange, end portions of the third plate fitting in the upper ends of the recesses of the first flanges and engaging the bottom surfaces of the recesses of the first flanges and end portions of the fourth plate fitting in the upper ends of the recesses of the second flanges and engaging the bottom surfaces of the recesses of the second flanges, said squaring surfaces of the recesses bounding the end edges of the third and fourth plates, and fasteners securing together the end portions of the third and fourth plates and the channels.

28. A rack as set forth in claim 27 having units mounted therein one above another, each unit having tongues at the ends thereof fitted in the recesses of the first flanges and fastened thereto.

29. A rack for mounting a plurality of units each having a front face and tongues at the ends thereof, said rack comprising an open rectangular frame having first and second opposite faces, said frame comprising a base, sides and a head, each of the sides comprising an elongate upright having in transverse cross-section a web in a plane generally perpendicular to the frame and at least a first flange extending inward from the web with respect to the frame at its first face, said base having opposite ends and said uprights extending up from said ends of the base, each of said first flanges comprising a first reach rooted in a respective web and a second reach offset inwardly with respect thereto to define a recess in an exterior surface of the flange running along substantially the full length thereof and extending from an edge of the flange in the direction toward the plane of the respective web, said recess having a depth and a bottom surface in a plane perpendicular to the respective web and terminating in an end surface, said base comprising at least one generally rectangular elongate base plate spanning the uprights and having end portions received in the recesses in the first flanges of said uprights, fasteners securing together the end portions of the base plate and the uprights, said head comprising at least one elongate generally rectangular head plate spanning the uprights and having end portions received in the recesses in said first flanges, and fasteners securing together the end portions of the base plate and the uprights, said units being adapted to be mounted on the rack one above another with the tongues of each unit fitted in the recesses of the first flanges, the tongues of each unit having thicknesses generally corresponding to the depths of the recesses whereby when the unit is mounted on the rack, the front face of the unit is generally flush with the exterior surfaces of the first reaches of the first flanges, and generally coplanar with the first face of the rack.

30. A rack as set forth in claim 29 wherein each of said first flanges has a series of holes spaced at intervals along its length for receiving fasteners extending through the tongues of each unit to attach the unit to the rack.

31. A rack as set forth in claim 29 in combination with said plurality of units mounted on the rack with the tongues of each unit received in respective recesses, each of said recesses terminating in an end surface extending at an angle, and the tongue of each unit received in the recess terminating in an end edge extending at a matching angle.

32. The combination of claim 29 wherein each of said first flanges has a series of holes spaced at intervals along its length, and fasteners extending through the tongues of each unit and into respective holes for attaching the unit to the rack.

33. A rack for mounting a plurality of units each having a front face and tongues at the ends thereof, said rack comprising an open rectangular frame having first and second opposite faces, said frame comprising a base, sides and a head, each of the sides comprising an elongate upright having in transverse cross-section a web in a plane generally perpendicular to the frame and at least a first flange extending inward from the web with respect to the frame at its first face, said base having opposite ends and said uprights extending up from said ends of the base, each of said first flanges comprising a first reach rooted in a respective web and a second reach offset inwardly with respect thereto to define a recess in an exterior surface of the flange running along substantially the full length thereof and extending from an edge of the flange in the direction toward the plane of the respective web, said recess having a depth and a bottom surface in a plane perpendicular to the respective web and terminating in an end surface, said units being adapted to be mounted on the rack one above another with the tongues of each unit fitted in the recesses of the first flanges, the tongues of each unit having thicknesses generally corresponding to the depths of the recesses whereby when the unit is mounted on the rack, the front face of the unit is generally flush with the exterior surfaces of the first reaches of the first flanges, and generally coplanar with the first face of the rack, wherein each upright has a second flange extending inward from the web generally parallel to said first flange at said second face of the rack, each second flange having an elongate recess in the exterior thereof along substantially the full length thereof extending from an edge of the flange in the direction toward the plane of the respective web, said recess having a bottom surface in a plane perpendicular to the respective web and terminating in an end surface.

* * * * *